US010658391B2

(12) United States Patent
Chen et al.

(10) Patent No.: US 10,658,391 B2
(45) Date of Patent: *May 19, 2020

(54) HYBRID SUBSTRATE ENGINEERING IN CMOS FINFET INTEGRATION FOR MOBILITY IMPROVEMENT

(71) Applicant: INTERNATIONAL BUSINESS MACHINES CORPORATION, Armonk, NY (US)

(72) Inventors: Chia-Yu Chen, White Plains, NY (US); Bruce B. Doris, Slingerlands, NY (US); Hong He, Schenectady, NY (US); Rajasekhar Venigalla, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/381,441

(22) Filed: Dec. 16, 2016

(65) Prior Publication Data
US 2017/0098665 A1 Apr. 6, 2017

Related U.S. Application Data

(63) Continuation of application No. 14/823,344, filed on Aug. 11, 2015, now Pat. No. 9,728,640.

(51) Int. Cl.
*H01L 27/12* (2006.01)
*H01L 21/30* (2006.01)
(Continued)

(52) U.S. Cl.
CPC .... *H01L 27/1211* (2013.01); *H01L 21/02381* (2013.01); *H01L 21/02433* (2013.01);
(Continued)

(58) Field of Classification Search
CPC ............ H01L 21/02433; H01L 21/308; H01L 21/823821; H01L 27/0924; H01L 27/1211; H01L 21/76224; H01L 21/763
See application file for complete search history.

(56) References Cited

U.S. PATENT DOCUMENTS 6,835,981 B2  12/2004  Yamada et al.
6,949,420 B1  9/2005  Yamashita
(Continued)

OTHER PUBLICATIONS

List of IBM Patents or Patent Applications Treated as Related dated Dec. 16, 2016, 2 pages.
(Continued)

*Primary Examiner* — Didarul A Mazumder
(74) *Attorney, Agent, or Firm* — Tutunjian & Bitetto, P.C.; Vazken Alexanian

(57) ABSTRACT

A method for forming a hybrid complementary metal oxide semiconductor (CMOS) device includes orienting a semiconductor layer of a semiconductor-on-insulator (SOI) substrate with a base substrate of the SOI, exposing the base substrate in an N-well region by etching through a mask layer, a dielectric layer, the semiconductor layer and a buried dielectric to form a trench and forming spacers on sidewalls of the trench. The base substrate is epitaxially grown from a bottom of the trench to form an extended region. A fin material is epitaxially grown from the extended region within the trench. The mask layer and the dielectric layer are restored over the trench. P-type field-effect transistor (PFET) fins are etched on the base substrate, and N-type field-effect transistor (NFET) fins are etched in the semiconductor layer.

17 Claims, 11 Drawing Sheets

(51) Int. Cl.

| | | |
|---|---|---|
| *H01L 21/82* | (2006.01) | |
| *H01L 21/84* | (2006.01) | |
| *H01L 29/78* | (2006.01) | |
| *H01L 27/092* | (2006.01) | |
| *H01L 21/8238* | (2006.01) | |
| *H01L 21/02* | (2006.01) | |
| *H01L 29/04* | (2006.01) | |
| *H01L 29/165* | (2006.01) | |
| *H01L 29/06* | (2006.01) | |
| *H01L 29/08* | (2006.01) | |
| *H01L 29/161* | (2006.01) | |
| *H01L 21/308* | (2006.01) | |

(52) U.S. Cl.
CPC ...... *H01L 21/02532* (2013.01); *H01L 21/308* (2013.01); *H01L 21/823807* (2013.01); *H01L 21/823814* (2013.01); *H01L 21/823821* (2013.01); *H01L 21/845* (2013.01); *H01L 27/0924* (2013.01); *H01L 27/1207* (2013.01); *H01L 29/045* (2013.01); *H01L 29/0649* (2013.01); *H01L 29/0847* (2013.01); *H01L 29/161* (2013.01); *H01L 29/165* (2013.01); *H01L 29/7842* (2013.01); *H01L 29/7848* (2013.01); *H01L 21/823864* (2013.01)

(56) References Cited

U.S. PATENT DOCUMENTS

| | | | |
|---|---|---|---|
| 7,118,986 B2 | 10/2006 | Steigerwalt et al. | |
| 7,393,730 B2 | 7/2008 | Hsu et al. | |
| 7,393,733 B2 | 7/2008 | Currie | |
| 7,432,149 B2 | 10/2008 | Wu et al. | |
| 7,569,857 B2 | 8/2009 | Shaheen et al. | |
| 7,803,670 B2 | 9/2010 | White et al. | |
| 7,968,944 B2 | 6/2011 | Joshi et al. | |
| 8,481,410 B1* | 7/2013 | LiCausi | H01L 21/823821 257/253 |
| 2005/0199984 A1 | 9/2005 | Nowak | |
| 2006/0049460 A1* | 3/2006 | Chen | H01L 21/823807 257/347 |
| 2007/0048919 A1 | 3/2007 | Adetutu et al. | |
| 2007/0269963 A1 | 11/2007 | Cheng et al. | |
| 2008/0020515 A1* | 1/2008 | White | H01L 21/76264 438/118 |
| 2008/0169528 A1* | 7/2008 | Kim | H01L 21/823412 257/506 |
| 2011/0193141 A1* | 8/2011 | Lin | H01L 29/045 257/255 |
| 2012/0276695 A1 | 11/2012 | Cheng et al. | |
| 2013/0071993 A1* | 3/2013 | Bian | H01L 21/823807 438/413 |
| 2015/0014789 A1 | 1/2015 | Xiong et al. | |
| 2016/0064485 A1* | 3/2016 | Weng | H01L 29/1054 257/77 |
| 2016/0225789 A1 | 8/2016 | Doris et al. | |
| 2016/0233319 A1* | 8/2016 | Lu | H01L 29/66795 |

OTHER PUBLICATIONS

Office Action issued in U.S. Appl. No. 15/202,940 dated Sep. 5, 2017, pp. 1-13.
Office Action issued in U.S. Appl. No. 15/202,940 dated Apr. 19, 2017, pp. 1-13.
Office Action issued in U.S. Appl. No. 15/202,940 dated Dec. 1, 2016, pp. 1-12.
U.S. Office Action issued in U.S. Appl. No. 15/202,940 dated May 25, 2018, 12 pages.

\* cited by examiner

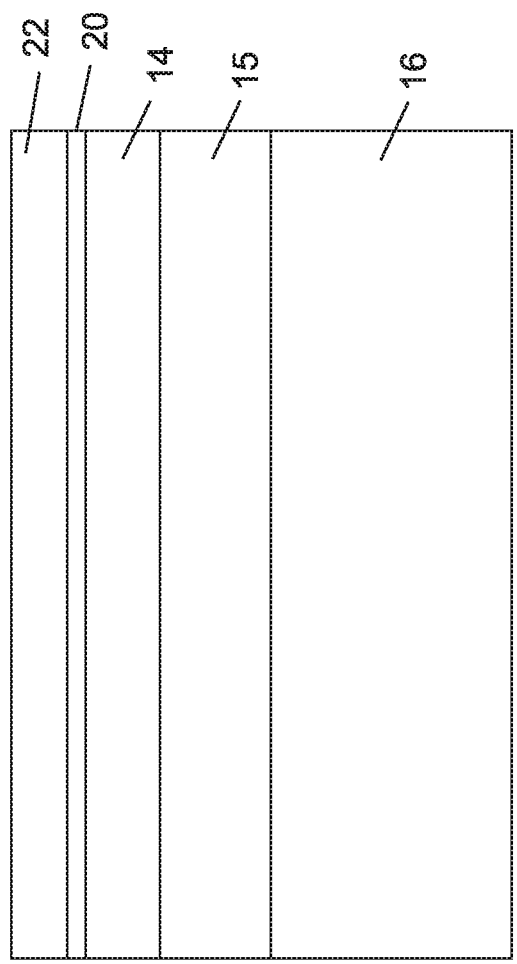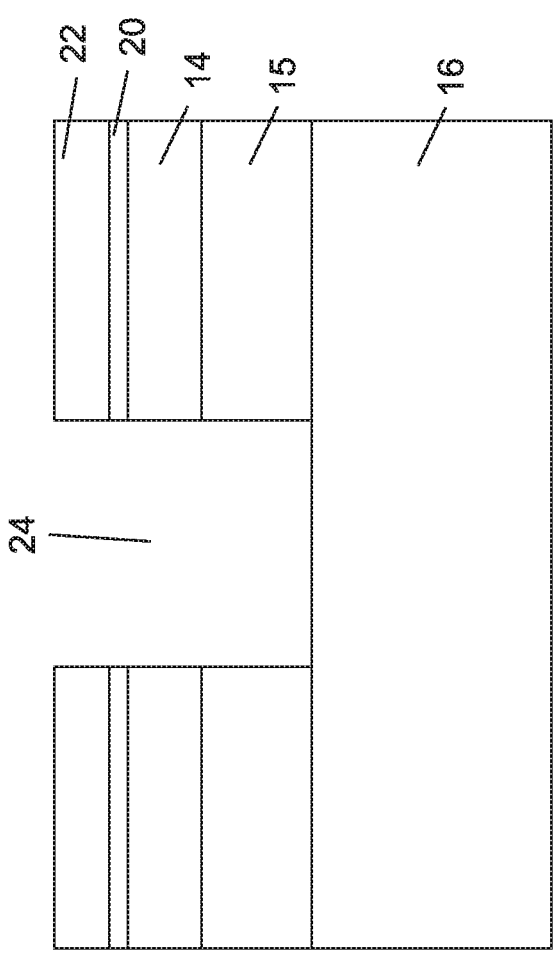

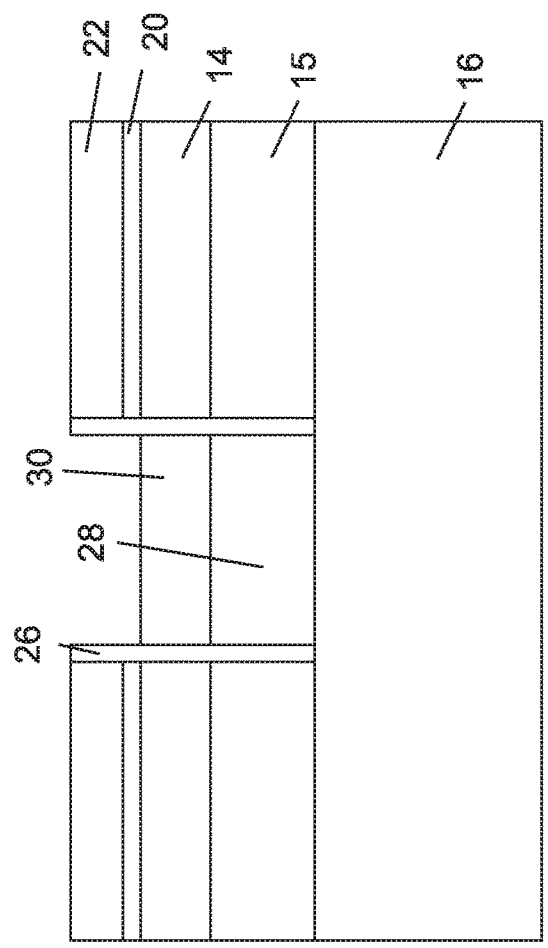
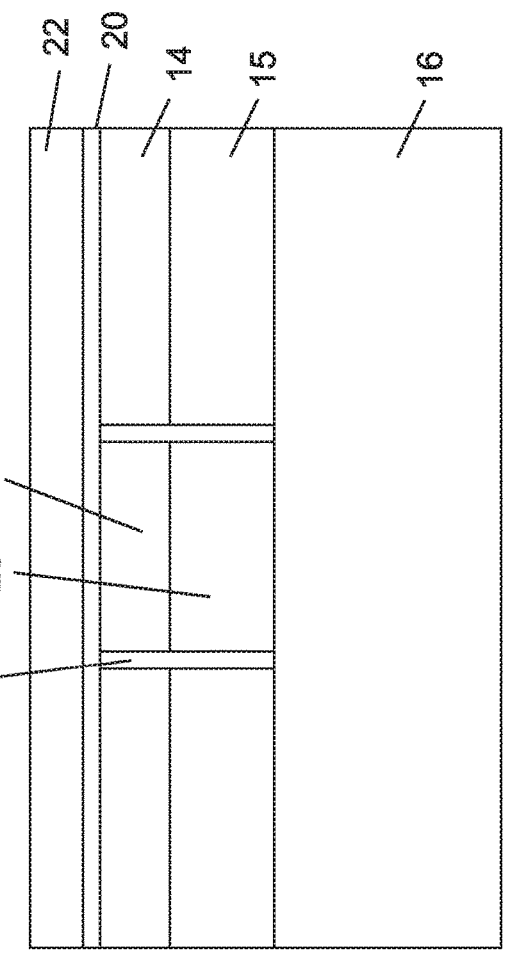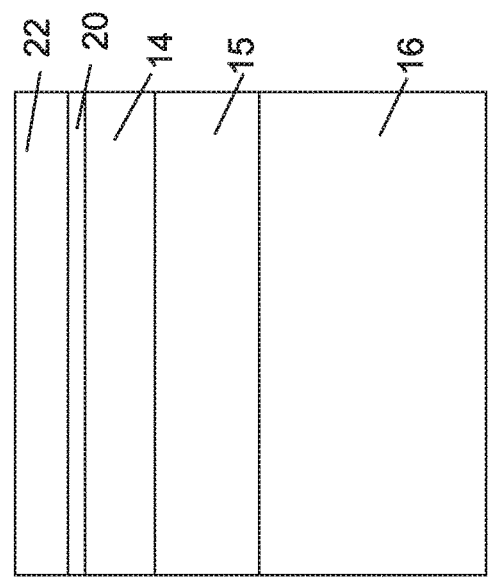

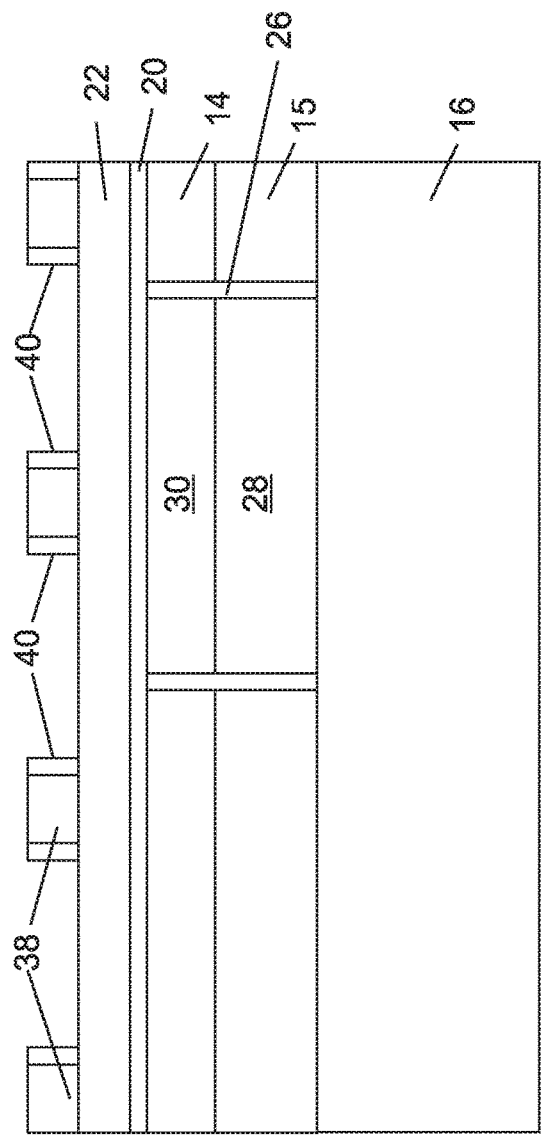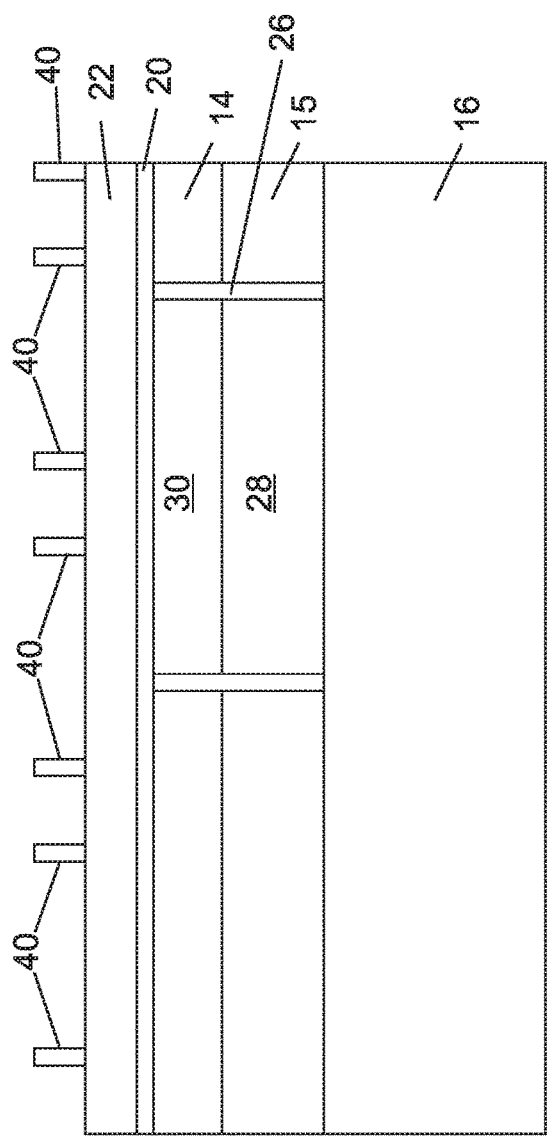

HYBRID SUBSTRATE ENGINEERING IN CMOS FINFET INTEGRATION FOR MOBILITY IMPROVEMENT

BACKGROUND

Technical Field

The present invention relates to semiconductor processing, and more particularly to fin field effect transistors and fabrication methods to improve carrier mobility.

Description of the Related Art

Many semiconductor devices employ fin structures for the formation of the field effect transistors (finFETs). High channel mobility and better/easier epitaxial growth processes are highly desired for very scaled complementary metal oxide semiconductor (CMOS) finFET integration. High Ge concentration SiGe is a promising channel material for performance improvements in p-type field effect transistors (PFETs) due to the expectation of high mobility. One problem in SiGe PFET fabrication is controlling n-type dopants (such as, As, P, etc.) since N-type dopants are known to have extremely high diffusivity in SiGe.

SUMMARY

A method for forming a hybrid complementary metal oxide semiconductor (CMOS) device includes orienting a semiconductor layer of a semiconductor-on-insulator (SOI) substrate with a base substrate of the SOI, exposing the base substrate in an N-well region by etching through a mask layer, a dielectric layer, the semiconductor layer and a buried dielectric to form a trench and forming spacers on sidewalls of the trench. The base substrate is epitaxially grown from a bottom of the trench to form an extended region. A fin material is epitaxially grown from the extended region within the trench. The mask layer and the dielectric layer are restored over the trench. P-type field-effect transistor (PFET) fins are etched on the base substrate, and N-type field-effect transistor (NFET) fins are etched in the semiconductor layer.

Another method for forming a hybrid complementary metal oxide semiconductor (CMOS) device includes orienting a silicon layer of a semiconductor-on-insulator (SOI) substrate with a silicon base substrate of the SOI by aligning device channels for the silicon layer and the base substrate, wherein the silicon layer includes a (100) wafer and the base substrate includes a (110) wafer and the device channels for the semiconductor layer and the base substrate are in a <110> direction; exposing the base substrate in an N-well region by etching through a mask layer, a dielectric layer, the semiconductor layer and a buried dielectric to form a trench; forming spacers on sidewalls of the trench; epitaxially growing the base substrate from a bottom of the trench to form an extended region; epitaxially growing SiGe from the extended region within the trench; restoring the mask layer and the dielectric layer over the trench and etching p-type field-effect transistor (PFET) fins on the base substrate and N-type field-effect transistor (NFET) fins in the silicon layer.

A hybrid complementary metal oxide semiconductor (CMOS) device includes a semiconductor-on-insulator (SOI) substrate including a silicon layer, a buried dielectric and a silicon base substrate, wherein the silicon layer includes a (100) wafer and the base substrate includes a (110) wafer and device channels for the semiconductor layer and the base substrate are in a <110> direction. An N-well region includes an epitaxially grown extended region formed from the base substrate and an epitaxially grown SiGe region grown from the extended region, wherein the SiGe region includes p-type field-effect transistor (PFET) fins formed on the base substrate. N-type field-effect transistor (NFET) fins are formed in the silicon layer outside the N-well region.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein:

FIG. 2 is a cross-sectional view of a semiconductor-on-insulator (SOI) substrate showing a dielectric layer (e.g., oxide) and a mask layer formed thereon in accordance with the present principles;

FIG. 3 is a cross-sectional view of the SOI substrate of FIG. 2 showing a trench formed to expose a base substrate in accordance with the present principles;

FIG. 6 is a cross-sectional view of the SOI substrate of FIG. 5 showing the extended epitaxial growth further extended by epitaxial growth (e.g., SiGe) within the trench in accordance with the present principles;

FIG. 7 is a cross-sectional view of the SOI substrate of FIG. 6 showing the dielectric layer and mask layer restored in an N-well region and showing another view including layers in other regions outside the N-well region in accordance with the present principles;

FIG. 10 is a cross-sectional view of the SOI substrate of FIG. 9 showing spacers formed on the mandrels in accordance with the present principles;

FIG. 11 is a cross-sectional view of the SOI substrate of FIG. 10 showing the mandrels removed in accordance with the present principles;

DETAILED DESCRIPTION

Figure 1:
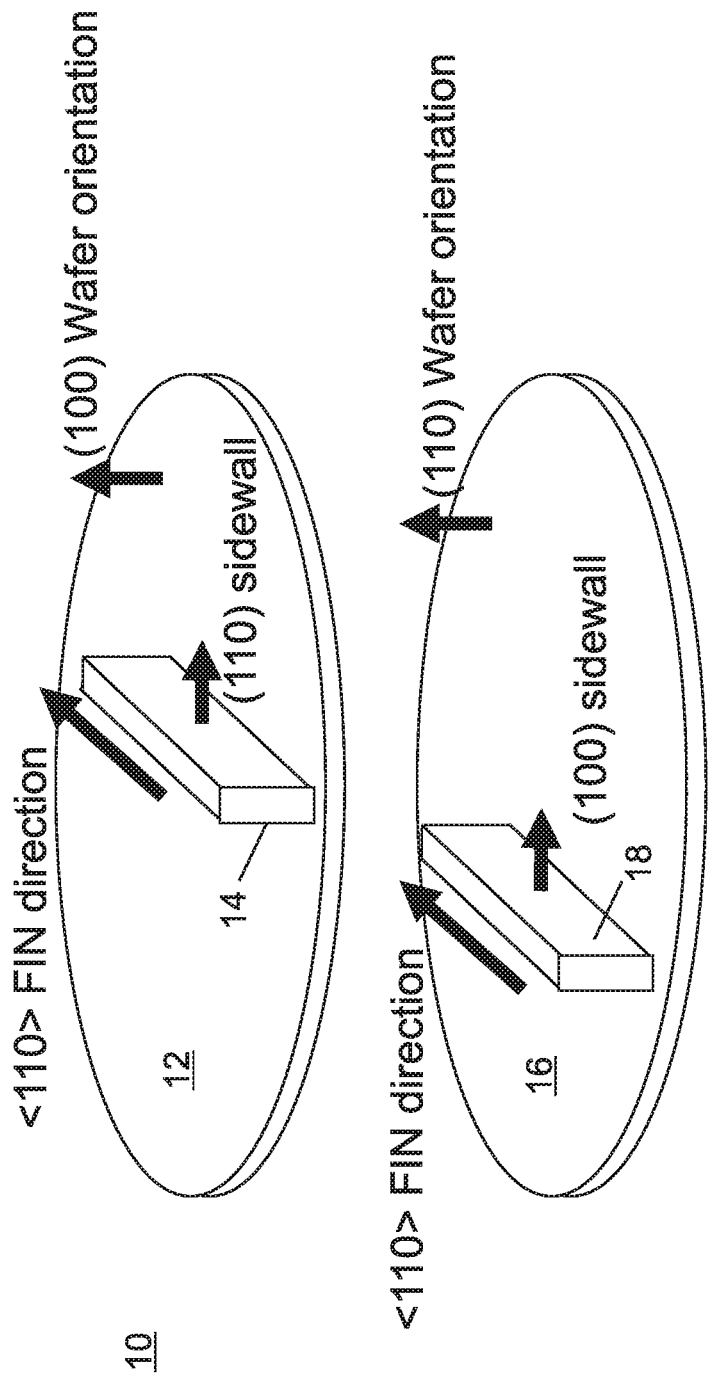
FIG. 1 is a schematic view of a semiconductor-on-insulator (SOI) substrate showing wafer orientation, fin direction and side wall orientations in accordance with the present principles.

In accordance with the present principles, a hybrid substrate and fabrication methods are provided for complementary metal oxide semiconductor (CMOS) fin field effect transistor (finFET) integration. The present embodiments employ preferred substrate crystallographic orientations to fabricate fins and their respective device channels. For example, for a monocrystalline semiconductor-on-insulator (SOI) wafer, a (100) wafer is rotated to have an orientation of <110> for a channel direction for a thin semiconductor layer of the SOI (e.g., silicon). N-type field effect transistors (FETs) or NFETs are fabricated on the SOI. A base substrate (e.g., silicon) under a buried dielectric (e.g., buried oxide or BOX) of the SOI is of (110) orientation with a <110> channel direction. P-type FETs or PFETs are fabricated on this crystal orientation (110) by first growing the base substrate to the level of the thin semiconductor layer of the SOI. In the present example, hole mobility is sensitive to strain in the <110> fin direction so it can be improved through, e.g., SiGe cladding condensation and strain engineering. A (100) fin sidewall provides rectangular epitaxial growth regions, which is desired for defectless source and drain regions and, e.g., SiGe condensation.

It is to be understood that the present invention will be described in terms of a given illustrative architecture (or wafer); however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a schematic diagram shows a SOI wafer 10. The SOI wafer 10 includes a thin semiconductor layer 12 in which a fin 14 will be formed thereon. The semiconductor layer 12 includes a (100) orientation and the fin 14 is disposed along a <110> direction with a (110) fin sidewall. The SOI wafer 10 includes a base substrate 16 in which a fin 18 will be formed thereon. The base substrate 16 includes a (110) orientation and the fin 18 is disposed along a <110> direction with a (100) fin sidewall. The fin orientations provide benefits for forming different types of devices. For example, NFETs can be formed from fins 12 while PFETs formed from fins 18. It is noted that FIG. 1 is schematic to demonstrate the crystal characteristics for two layers in a SOI wafer 10 as an illustration. Other orientations may be employed. A buried dielectric layer is not depicted between the layer 12 and the base substrate 16. Once the wafer 10 is fabricated the process proceeds as follows.

Referring to FIG. 2, the SOI wafer 10 includes base substrate 16, a buried dielectric 15 and a semiconductor layer 14. The base substrate 16 and the semiconductor layer 14 preferably include monocrystalline silicon, however, other materials may be employed, e.g., SiGe, Ge, etc. with the same or different crystallographic orientations employed to take advantage of the crystallographic orientations for different device types. The buried dielectric layer 15 may include a buried oxide layer (BOX), although other dielectric materials may be employed. A thin dielectric layer 20 is formed on the semiconductor layer 14 and may include a deposited or grown oxide. A mask layer 22 is formed over the thin dielectric layer 20. The mask layer 22 may include a nitride or other material that is selectively etchable relative to the underlying layers.

Referring to FIG. 3, a trench or opening 24 is formed to expose the base substrate 16. The mask layer 22 may be patterned using lithographic techniques, and the mask layer 22 may be employed to protect areas from a reactive ion etch (RIE) or similar etching process that forms the trench 24 through the dielectric layer 20, the semiconductor layer 14 and the buried dielectric 15. The trench 24 is formed in an N-well region of the base substrate 16 (where PFET devices will be formed).

Figure 4:
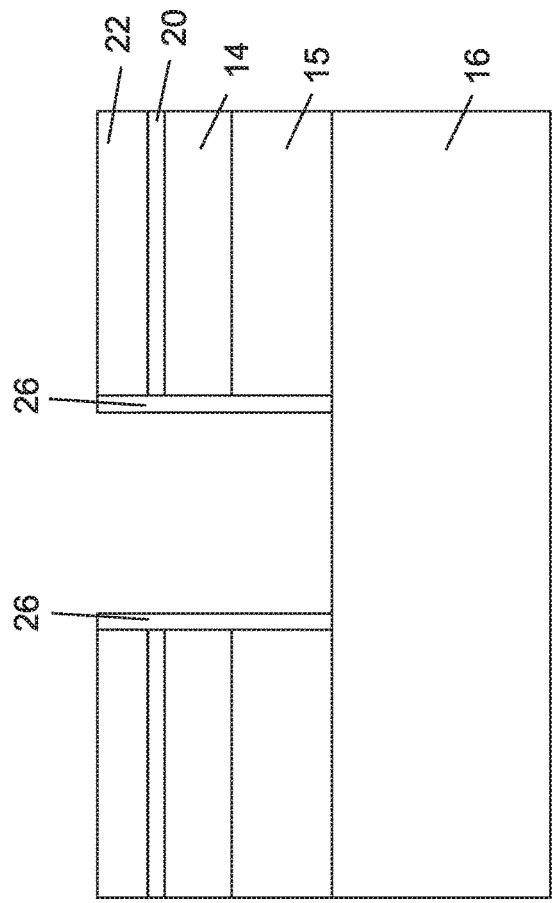
FIG. 4 is a cross-sectional view of the SOI substrate of FIG. 3 showing spacers formed on sidewalls of the trench in accordance with the present principles.

Referring to FIG. 4, a spacer layer is deposited (conformally) and etched (e.g., by RIE) to remove the layer from horizontal surfaces to form spacers 26. The spacers 26 are formed from a dielectric material, such as silicon nitride. The spacers 26 extend down to the base substrate 16.

Figure 5:
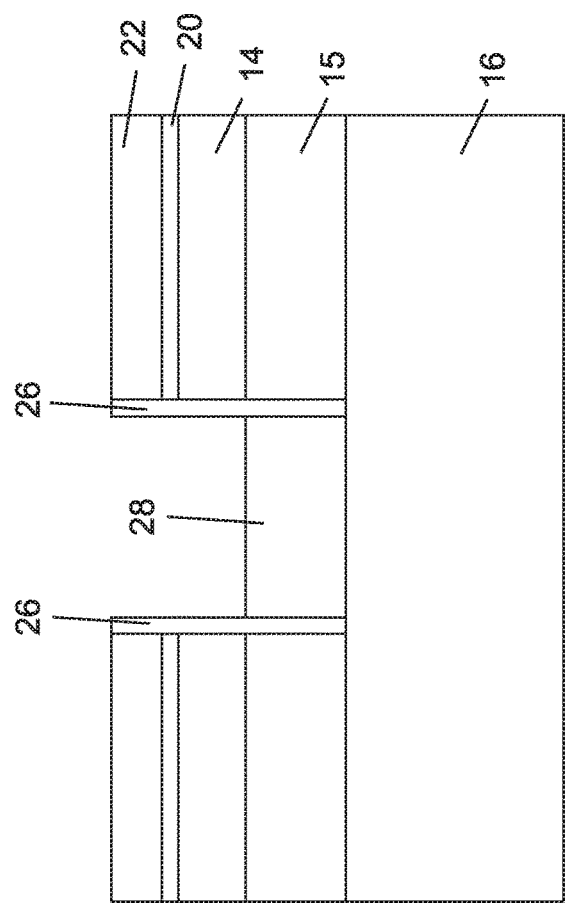
FIG. 5 is a cross-sectional view of the SOI substrate of FIG. 4 showing the base substrate extended by epitaxial growth within the trench in accordance with the present principles.

Referring to FIG. 5, an epitaxial growth process is employed to extend the base substrate 16 by growing region 28. A molecular beam epitaxy (MBE) or metal organic chemical vapor deposition process (MOCVD) may be employed. Region 28 includes a same material as the base substrate 16, e.g., monocrystalline Si. Region 28 is preferably grown to about the height of the buried dielectric layer 16, although other heights may be employed.

Referring to FIG. 6, another epitaxial growth process is employed to extend the region 28 with region 30. MBE or MOCVD may be employed. Region 30 includes a different material than the base substrate 16. For example, if the base substrate 16 includes Si, region 30 may include SiGe. Other materials may be employed as well depending on specifications of the device being fabricated. Region 30 is preferably grown to about the height of the semiconductor layer 14. The regions 30 will be employed to form fins for PFETs while the adjacent regions of the semiconductor layer 14 will be employed to form fins for NFETs. Other heights may be employed for region 30 as well.

Referring to FIG. 7, the thin dielectric layer 20 and the mask layer 22 are restored over the region 30. This may be accomplished by completely removing layers 20 and 22 and then depositing the layer 20, 22 as before. The removal of the layers 22, 20 may be performed by chemical mechanical polishing (CMP) followed by a re-deposition of layers 20 and 22 by, e.g., chemical vapor deposition (CVD) or similar process.

FIG. 7 shows the N-well region 34 and other regions on the device 32 after the layers 22, 20 are reformed. Other processes or process sequences may be employed to form or reform the layers 20 and 22.

Figure 8:
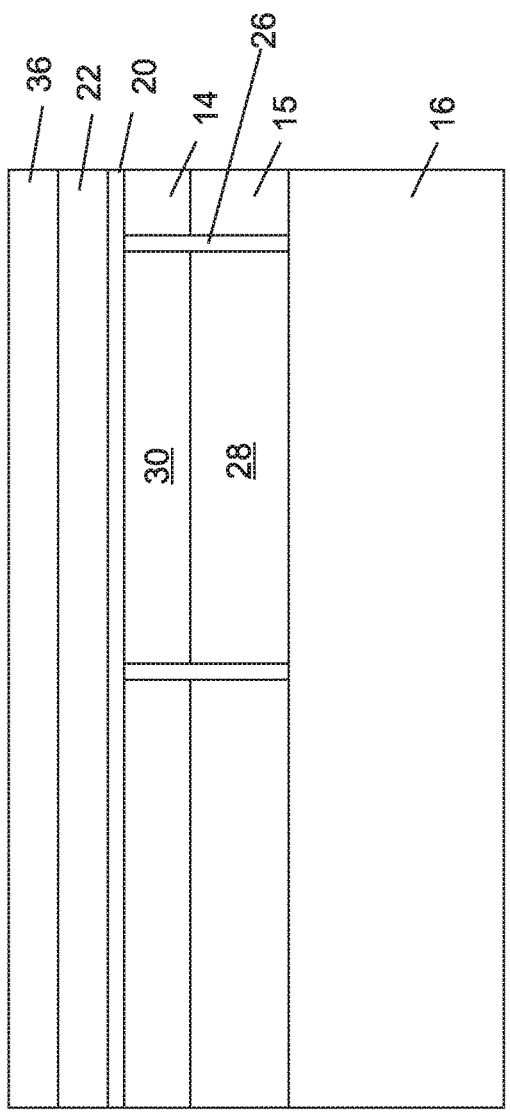
FIG. 8 is a cross-sectional view of the SOI substrate of FIG. 7 showing a mandrel layer formed in accordance with the present principles.

Referring to FIG. 8, a spacer image transfer (SIT) process is employed to generate mask elements for etching fins. First, a mandrel layer 36 is deposited over the mask layer 22. The mandrel layer 36 may include amorphous silicon, although other materials may be employed.

Figure 9:
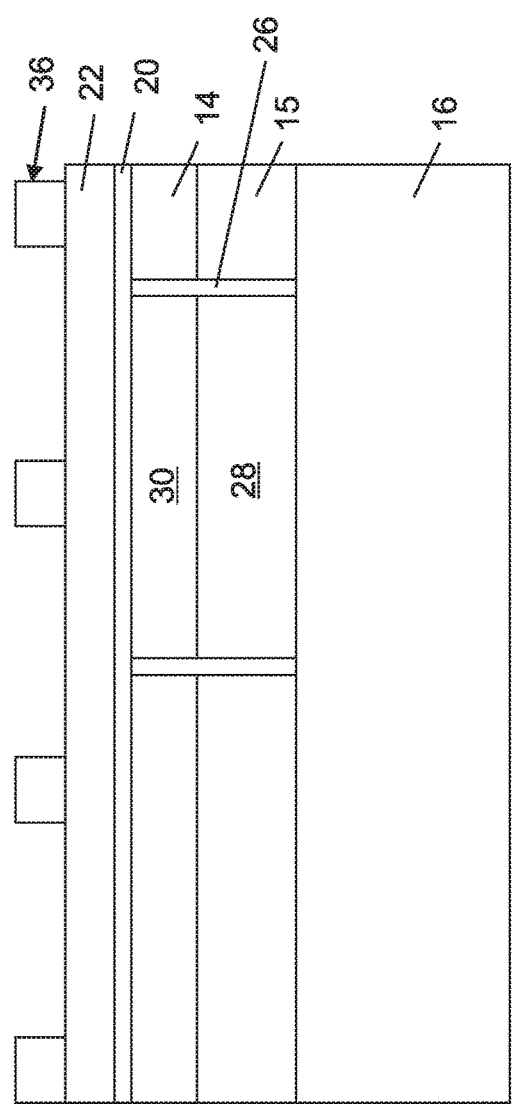
FIG. 9 is a cross-sectional view of the SOI substrate of FIG. 8 showing the mandrel layer patterned in accordance with the present principles.

Referring to FIG. 9, the mandrel layer 36 is patterned using lithographic patterning techniques. The mandrel layer 36 is etched to form mandrels 38.

Referring to FIG. 10, a dielectric layer is conformally deposited over the mandrels 38. The dielectric layer may include silicon nitride although other materials may be employed. A RIE process may be employed to form spacers 40 by removing the dielectric layer from horizontal surfaces.

Referring to FIG. 11, the mandrels 38 are selectively removed using an etch process. The etch process may include a wet etch or a dry etch selective to the materials of the spacers 40 and the mask layer 22, e.g., nitride.

Figure 12:
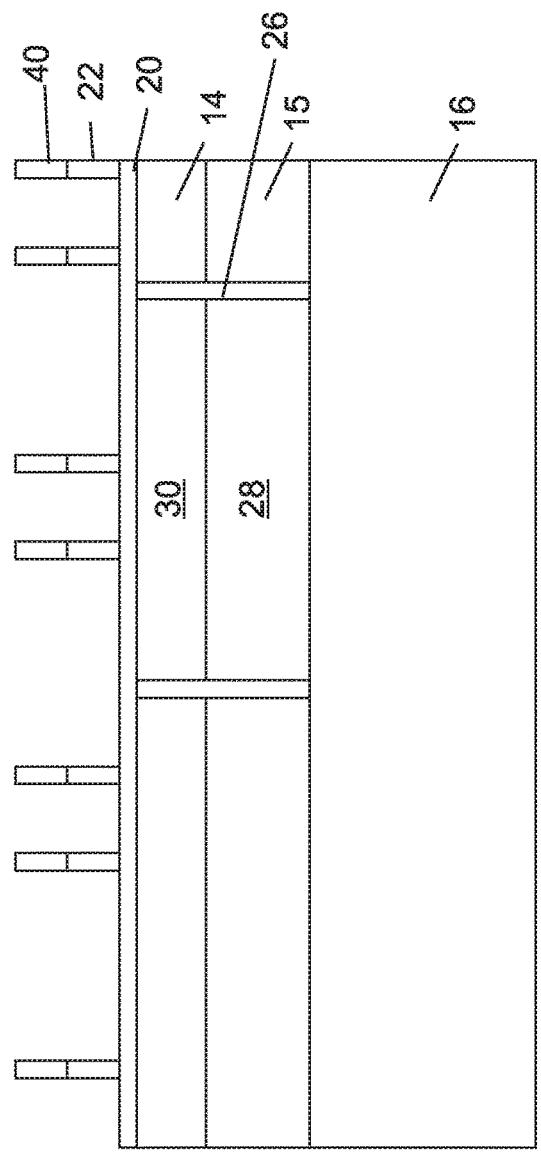
FIG. 12 is a cross-sectional view of the SOI substrate of FIG. 11 showing the spacers as an etch mask for etching the mask layer in accordance with the present principles.

Referring to FIG. 12, a RIE process is performed to pattern the mask layer 22 using the SIT formed spacers 40.

Figure 13:
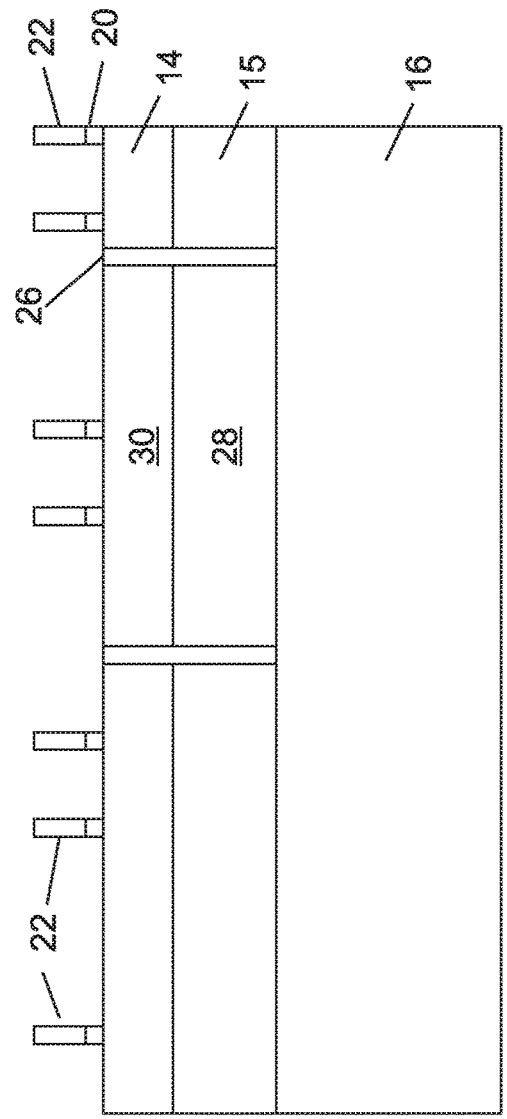
FIG. 13 is a cross-sectional view of the SOI substrate of FIG. 12 showing the dielectric layer etched in accordance with the present principles.

Referring to FIG. 13, another RIE process is performed to pattern the dielectric layer 20 using the mask layer 22 as an etch mask. Several different options are available for continued processing. For example, one option is depicted in FIG. 14, and another option is depicted in FIGS. 15-17.

Figure 14:
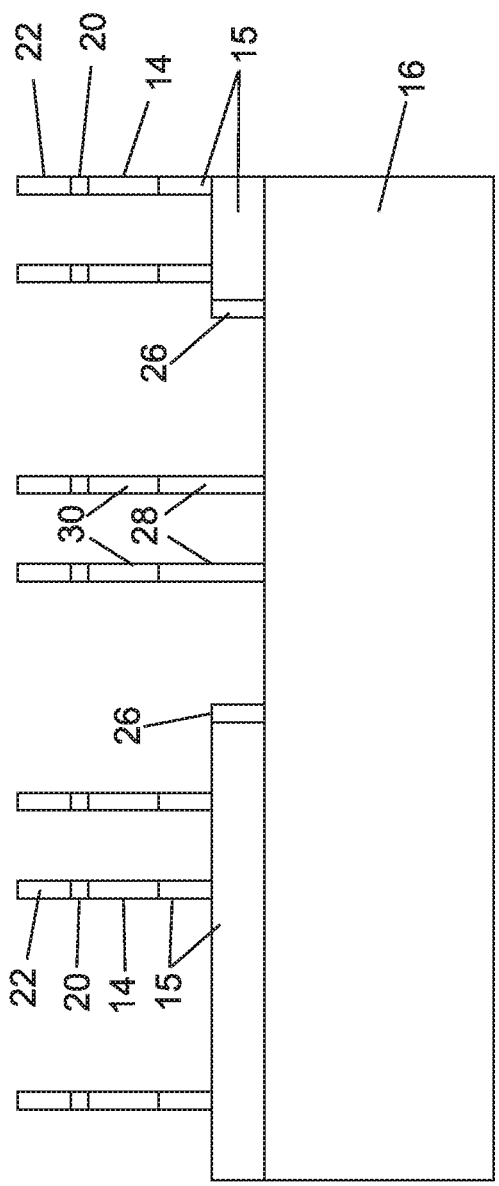
FIG. 14 is a cross-sectional view of the SOI substrate of FIG. 13 showing fins overetched into the buried dielectric (to form dielectric pedestals) and through the extended regions (e.g., SiGe and Si) (to form semiconductor pedestals) in accordance with one embodiment.

Referring to FIG. 14, etching is continued to reach the base substrate 16. Once the etch is completed to the base substrate 16, the etch chemistry is switched to a 1:1 selectivity between the material of the base substrate 16 (e.g., Si) and the buried dielectric 15 (e.g., oxide). This will then etch the buried dielectric 15 instead of causing sidewall erosion to the semiconductor layer 14. This is one option.

Figure 15:
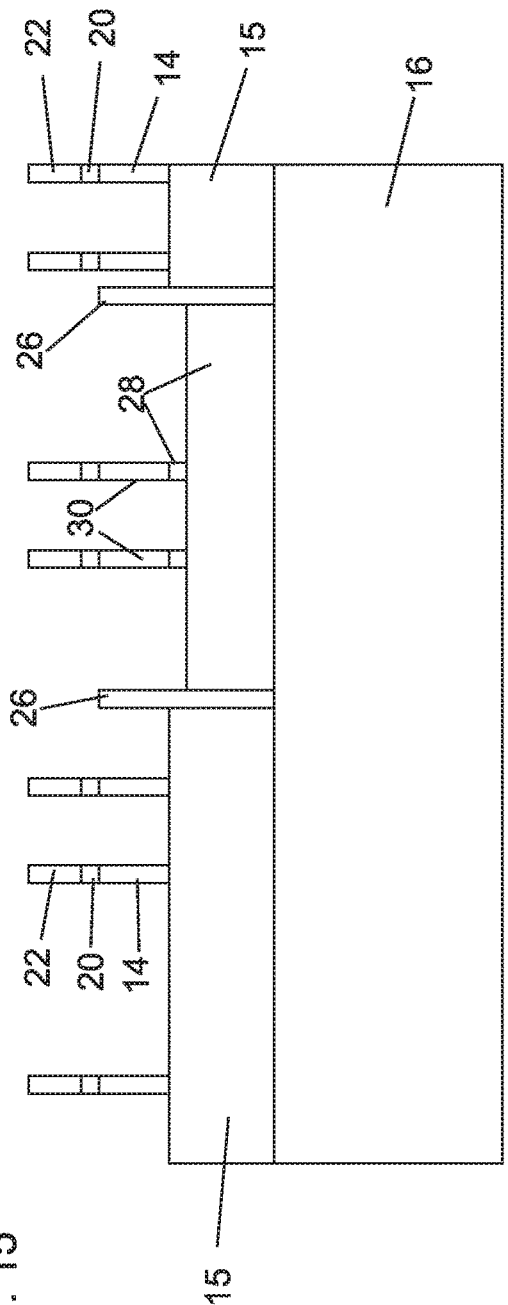
FIG. 15 is a cross-sectional view of the SOI substrate of FIG. 13 showing fins etched into the extended regions (e.g., SiGe and Si) in accordance with another embodiment.

Referring to FIG. 15, another option is shown. Fins are etched until all fins in semiconductor layer 14 are defined and then some nominal overetch into region 28 is made.

Figure 16:
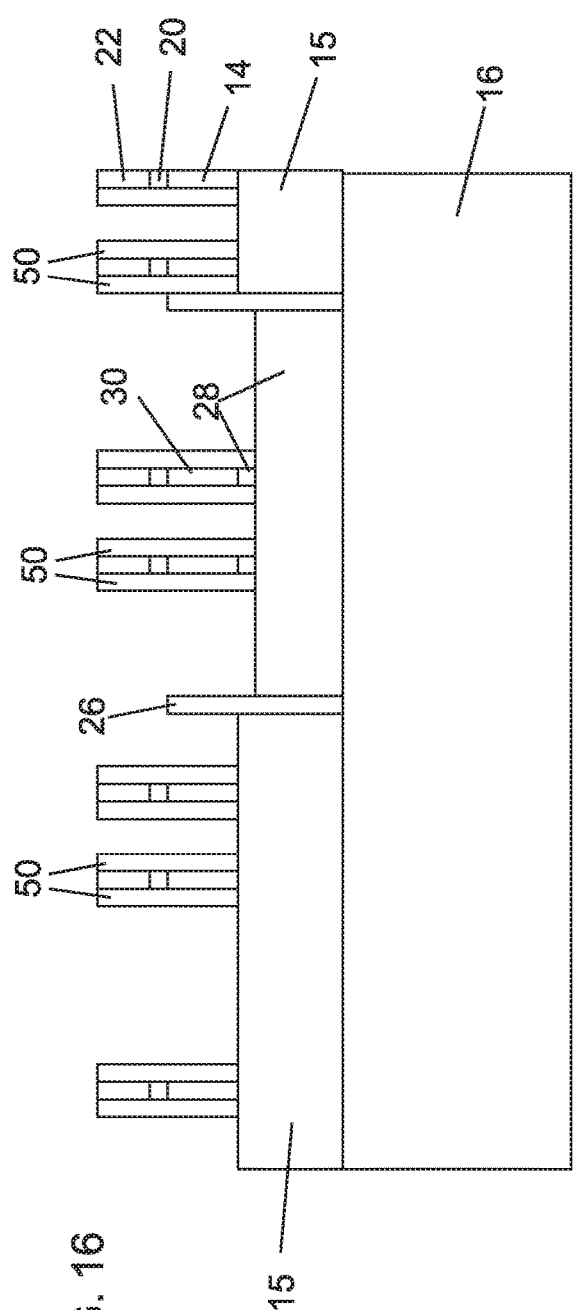
FIG. 16 is a cross-sectional view of the SOI substrate of FIG. 14 showing fins with fin spacers formed thereon in accordance with the present principles.
Figure 17:
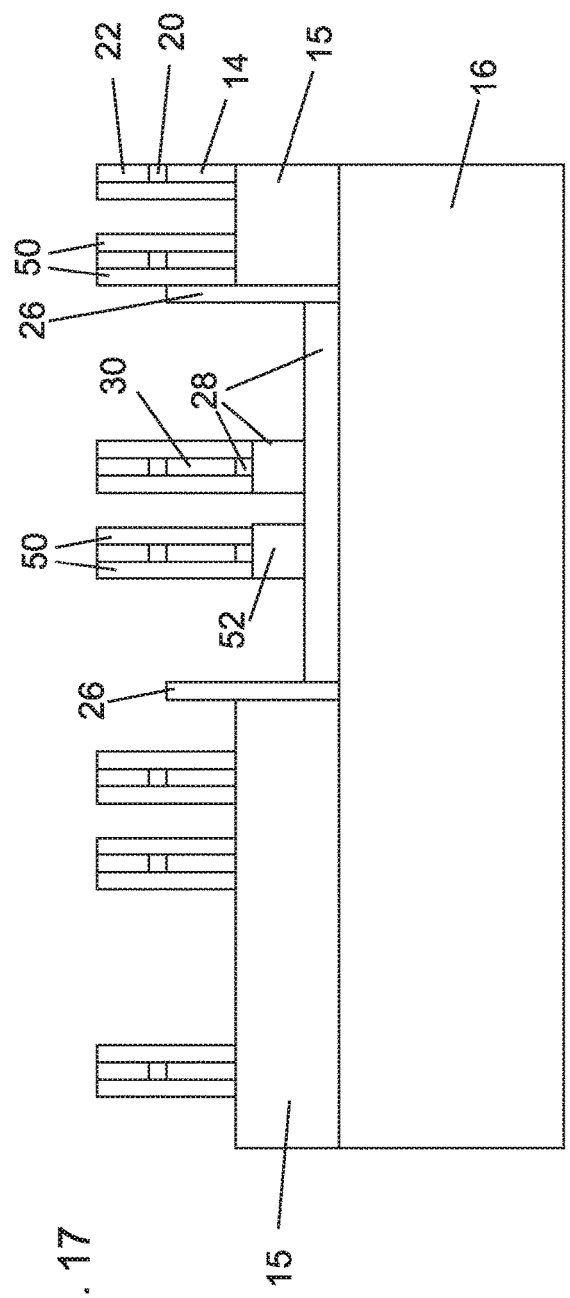
FIG. 17 is a cross-sectional view of the SOI substrate of FIG. 15 showing fins with fin spacers forming semiconductor pedestals in the extension regions in accordance with the present principles.

Referring to FIG. 16, a thin layer, e.g., an oxide (e.g., 2-3 nm) is deposited followed by spacer RIE to form spacers 50.

Referring to FIG. 17, the region 28 is etched (e.g., by RIE) selectively to the material of buried dielectric layer 15, spacers 50 and layers 22 and 26, e.g., etch Si selectively to oxide and nitride. This etches a pedestal 52 in the region 28. The SiGe of region 30 may be annealed to diffuse the Ge into the semiconductor layer 14 portions of the fins (SiGe condensation).

Figure 18:
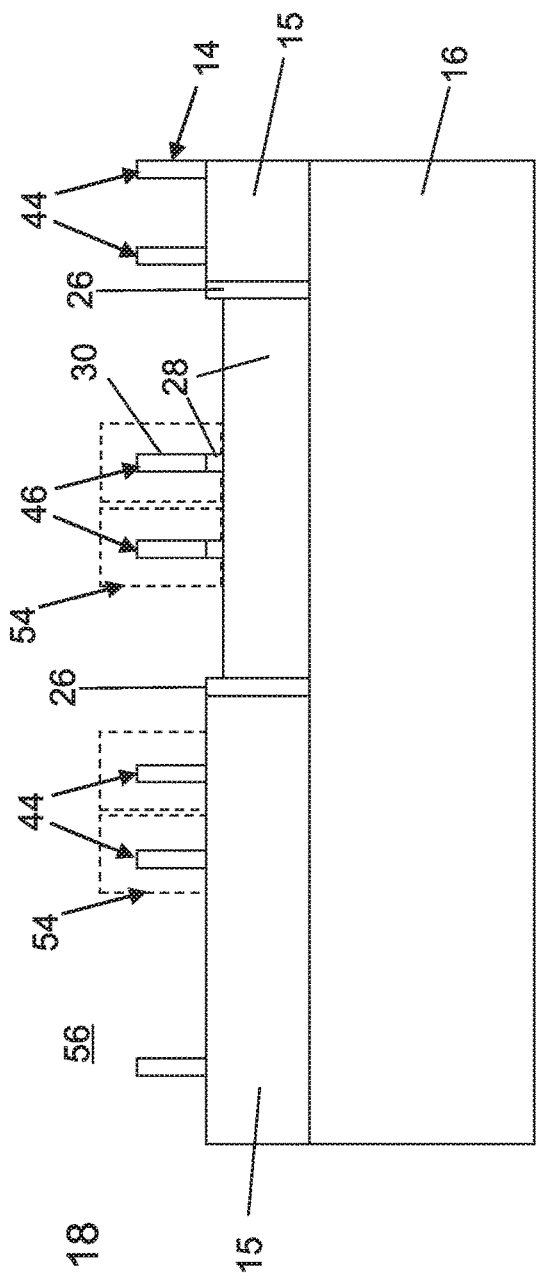
FIG. 18 is a cross-sectional view of final structure showing fins formed in a hybrid arrangement in accordance with the present principles.

Referring to FIG. 18, while different heights and structures may be employed for fins and around fins, a final structure 56 (for fin formation before further processing) is illustratively shown in accordance with one embodiment. The structure 56 includes fins 44 employed for NFETs formed on the buried dielectric layer 15. The fins 44 are formed from the semiconductor layer 14. The structure 56 includes fins 46 employed for PFETs formed on the region 28, which is extended from the base substrate 16. The fins 46 are formed from the region 28 and the region 30. Fins 44 and 46 have a same crystallographic channel direction <110> but employ (100) and (110) wafer orientations. The (110) substrate lends itself to rectangular shaped SiGe epitaxially grown regions (e.g., rectangular source and drain (S/D) regions).

In addition, the PFET fins 46 are formed in SiGe, and the NFET fins 44 are formed in Si. SiGe PFETs have improved mobility (especially with higher Ge content, e.g., 50 at % to about at 100% Ge). NFETs have a higher mobility in Si. Improved mobility also results from a common fin direction where the fin is crystallographically aligned to provide a high carrier mobility (e.g., <110> direction in Si).

For the final structure 56, processing continues using known processes. Including forming gate structures and growing S/D regions 54. By providing, the fins 46 on the base substrate having a particular crystal orientation (e.g., (100) sidewalls), the S/D regions 54 are grown with a rectangular shape mimicking the fin shape and permitting a preferred S/D region shape (as opposed to diamond or hexagonal shaped S/D regions, which increase the chances or forming voids or other issues in subsequent processing). The rectangular shaped S/D regions 54 are defectless and provide a more pristine region.

Figure 19:
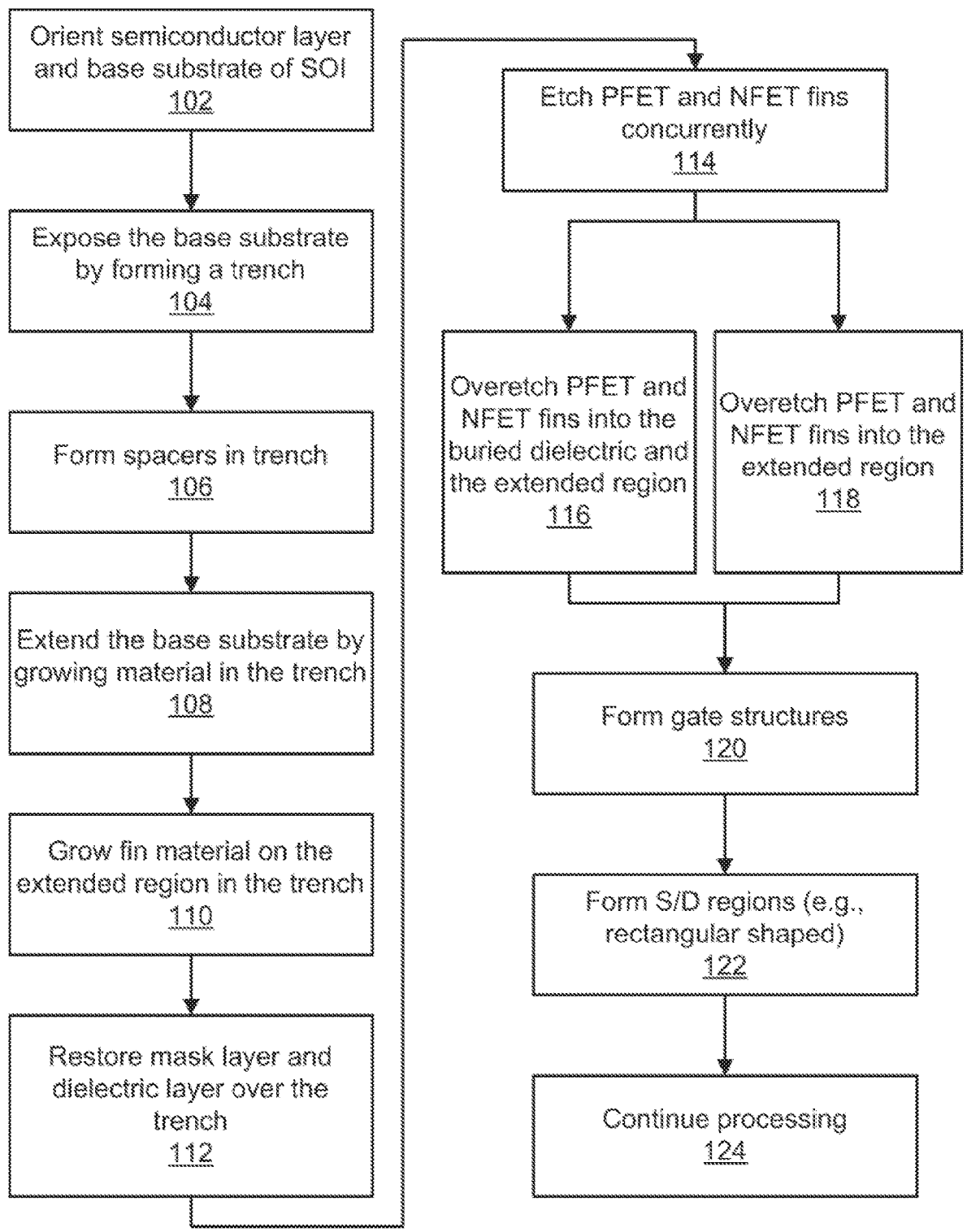
FIG. 19 is a block/flow diagram showing a method for forming a hybrid complementary metal oxide semiconductor (CMOS) device in accordance with illustrative embodiments.

Referring to FIG. 19, a method for forming a hybrid complementary metal oxide semiconductor (CMOS) device is illustratively shown. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a semiconductor layer of a semiconductor-on-insulator (SOI) substrate is oriented relative to a base substrate of the SOI. This can be performed during the fabrication of the SOI substrate during a wafer transfer process using different wafer oriented materials. The semiconductor layer and the base substrate may include monocrystalline silicon. The semiconductor layer and the base substrate may be oriented by aligning device channels for the semiconductor layer and the base substrate. For example, the semiconductor layer may include a (100) wafer and the base substrate may include a (110) wafer. The device channels for the semiconductor layer and the base substrate may be aligned in a <110> direction. Other configurations may also be provided.

In block 104, the base substrate is exposed in an N-well region by etching through a mask layer, a dielectric layer, the semiconductor layer and a buried dielectric to form a trench. In block 106, spacers are formed on sidewalls of the trench. In block 108, the base substrate is extended by epitaxially growing an extended region from a bottom of the trench. In one embodiment, the extended region is extended to about a height of the buried dielectric. In block 110, a fin material is epitaxially grown from the extended region within the trench. The fin materials may include SiGe. In one embodiment, the fin material is extended to about a height of the semiconductor layer.

In block 112, the mask layer and the dielectric layer are restored over the trench. This may include removing the original mask layer and dielectric layer by e.g., CMP and re-depositing these layers. In block 114, p-type field-effect transistor (PFET) fins on the base substrate and N-type field-effect transistor (NFET) fins in the semiconductor layer are concurrently etched to form a hybrid device where PFET fins are formed on the bulk substrate (base substrate) and the NFET fins are formed from the semiconductor layer (thinner silicon of the SOI). The etch process may include employing a spacer image transfer (SIT) process to concurrently form PFET and NFET fins.

In block 116, in one embodiment, the fins are overetched into the buried dielectric and the extended region using an etch chemistry configured to protect material of the semiconductor layer during etching. This overetch forms pedestals for the fins in the buried dielectric (e.g., oxide) and the extended region (e.g., Si). The etch chemistry is preferably a 1:1 for Si:oxide. In block 118, in another embodiment, fin spacers are formed on the fins, and the fins overetched into the extended region to form pedestals in the base substrate. The buried dielectric remains intact. Blocks 116 and 118 (as well as other steps) are optional.

In block 120, gate structures are formed over the fins. In block 122, S/D regions are grown. The S/D regions are preferably grown as rectangular-shaped regions on the fins. The rectangular shape is provided based on the fin crystallographic orientation. This reduces the possibility of defects. In block 124, processing continues with the formation of contacts in interlevel dielectric and the formation of metallizations, etc.

Having described preferred embodiments for hybrid substrate engineering in CMOS finFET integration for mobility improvement (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for forming a hybrid complementary metal oxide semiconductor (CMOS) device, comprising:
    orienting a semiconductor layer of a semiconductor-on-insulator (SOI) substrate with a base substrate of the SOI;
    exposing the base substrate in an N-well region by etching through a mask layer, a dielectric layer, the semiconductor layer and a buried dielectric to form a trench;
    forming spacers on sidewalls of the trench;
    epitaxially growing the base substrate from a bottom of the trench to form an extended region;
    epitaxially growing a fin material, including a material different from the base substrate, from the extended region within the trench;
    restoring the mask layer and the dielectric layer over the trench; and
    etching both the fin material and the extended region across their entire vertical heights to form fins therefrom of a much lesser width than the fin material to define P-type fin field-effect transistor (PFET) fins such that the fin material forms an entirety of a device channel in each of the PFET fins on the base substrate and etching fins for N-type fin field-effect transistor (NFET) fins in the semiconductor layer.

2. The method as recited in claim 1, wherein the semiconductor layer and the base substrate include monocrystalline silicon and orienting the semiconductor layer with the base substrate includes aligning device channels for the semiconductor layer and the base substrate.

3. The method as recited in claim 2, wherein the semiconductor layer includes a (100) wafer and the base substrate includes a (110) wafer and the device channels for the semiconductor layer and the base substrate are in a <110> direction.

4. The method as recited in claim 1, wherein epitaxially growing the fin material from the extended region within the trench includes epitaxially growing SiGe material from the extended region.

5. The method as recited in claim 1, wherein etching PFET fins on the base substrate and NFET fins in the semiconductor layer includes overetching the fins into the buried dielectric and the extended region using an etch chemistry configured to protect material of the semiconductor layer during etching.

6. The method as recited in claim 1, further comprising forming fin spacers on the fins and overetching the fins into the extended region to form pedestals in the base substrate.

7. The method as recited in claim 1, wherein etching includes employing a spacer image transfer (SIT) process.

8. The method as recited in claim 1, further comprising growing rectangular-shaped source and drain regions on the fins.

9. The method as recited in claim 1, wherein the extended region is extended to a height of the buried dielectric.

10. The method as recited in claim 1, wherein the fin material is extended to a height of the semiconductor layer.

11. A method for forming a hybrid complementary metal oxide semiconductor (CMOS) device, comprising:
    orienting a silicon layer of a semiconductor-on-insulator (SOI) substrate with a silicon base substrate of the SOI by aligning device channels for the silicon layer and the silicon base substrate, wherein the silicon layer includes a (100) wafer and the silicon base substrate includes a (110) wafer and the device channels for the silicon layer and the silicon base substrate are in a <110> direction;
    exposing the silicon base substrate in an N-well region by etching through a mask layer, a dielectric layer, the silicon layer and a buried dielectric to form a trench;
    forming spacers on sidewalls of the trench;
    epitaxially growing the silicon base substrate from a bottom of the trench to form an extended region;
    epitaxially growing a fin material including SiGe from the extended region within the trench;
    restoring the mask layer and the dielectric layer over the trench; and
    etching both the fin material and the extended region across their entire vertical heights to form fins therefrom of a much lesser width than the fin material to define P-type fin field-effect transistor (PFET) fins such that the fin material forms an entirety of a device channel in each of the PFET fins on the silicon base substrate and etching fins for N-type fin field-effect transistor (NFET) fins in the silicon layer.

12. The method as recited in claim 11, wherein etching PFET fins on the base substrate and NFET fins in the silicon layer includes overetching the fins into the buried dielectric and the extended region using an etch chemistry configured to protect material of the silicon layer during etching.

13. The method as recited in claim 11, further comprising forming fin spacers on the fins and overetching the fins into the extended region to form pedestals in the silicon base substrate.

14. The method as recited in claim 11, wherein etching includes employing a spacer image transfer (SIT) process.

15. The method as recited in claim 11, further comprising growing rectangular-shaped source and drain regions on the fins.

16. The method as recited in claim 11, wherein the extended region is extended to a height of the buried dielectric.

17. The method as recited in claim 11, wherein the fin material is extended to a height of the silicon layer.

* * * * *